United States Patent

Rogers et al.

[11] Patent Number: 5,821,692
[45] Date of Patent: Oct. 13, 1998

[54] ORGANIC ELECTROLUMINESCENT DEVICE HERMETIC ENCAPSULATION PACKAGE

[75] Inventors: Stephen P. Rogers, Phoenix; Franky So, Tempe; Song Q. Shi, Phoenix; Brian A. Webb, Chandler, all of Ariz.

[73] Assignee: Motorola, Inc., Schaumburg, Ill.

[21] Appl. No.: 757,002

[22] Filed: Nov. 26, 1996

[51] Int. Cl.⁶ ..................................... H01J 1/62
[52] U.S. Cl. .......................... 313/512; 313/506; 313/493
[58] Field of Search .................... 313/512, 506, 313/483, 493; 315/169.3; 428/690, 917

[56] References Cited

U.S. PATENT DOCUMENTS 4,443,063   4/1984   Nishiyama ............................. 313/483
4,963,788  10/1990   King et al. ............................. 313/512

Primary Examiner—Vip Patel
Attorney, Agent, or Firm—Eugene A. Parsons

[57] ABSTRACT

An organic electroluminescent device array encapsulating package including an organic electroluminescent device on a supporting substrate. A cover having a rim engaging the supporting substrate is spaced from and hermetically encloses the organic electroluminescent device. A dielectric liquid having benign chemical properties fills the space between the cover and the organic electroluminescent device, providing both an efficient medium for heat transmission and an effective barrier to oxygen and moisture.

8 Claims, 1 Drawing Sheet

ORGANIC ELECTROLUMINESCENT DEVICE HERMETIC ENCAPSULATION PACKAGE

FIELD OF THE INVENTION

The present invention pertains to organic electroluminescent devices and more specifically to hermetic encapsulation of organic electroluminescent devices.

BACKGROUND OF THE INVENTION

Organic electroluminescent devices (OED), and especially organic light emitting diodes (LEDs) and the like, generally utilize a layer of reactive metal in the cathode to ensure efficient injection of electrons and low operating voltages. However, reactive metals are particularly susceptible to damage due to oxidation in the presence of oxygen and moisture. Oxidation of the metal severely limits the lifetime of a device. A hermetic seal is normally required to achieve long term stability and longevity. Several types of hermetic seals are utilized, the most common of which are inorganic materials, such as metals and the like.

A further problem is a result of the fact that the organic layers, particularly the hole transport materials are sensitive to temperatures as related to their property of glass transition. The glass transition is best described as a molten solid, and for many organic materials occurs at relatively low temperatures, such as below 100 degrees Celsius. The potential for the organic material to crystallize is greater once the glass transition has been reached. Crystallization of an organic film in the fabrication of an OED leads to low charge mobility, charge traps, pinholes and shorts. In many instances, even approaching the critical temperatures of the organic layers, especially if the elevated temperatures are maintained for relatively long periods of time, can degrade the organic material and reduce the reliability and/or the longevity of the device.

Temperatures high enough to damage or degrade OEDs often occur in the fabrication and encapsulation of the OED, and during operation, especially when used in arrays. OEDs are current driven devices in which much of the consumed energy is converted into heat. Removing the heat is a problem since OEDs are typically thermally coupled to glass and an inert gas ambient, each having poor thermal conductivity and heat capacity. In OED arrays, devices not necessarily generating heat themselves, as an off pixel, are heated by nearby devices, since each is connected by a grid of electrodes. The grid of electrodes are typically an ITO anode and a low work function metal cathode, each of which are thermally conductive and have higher heat capacities than does glass or the inert gas ambient.

Accordingly, it is highly desirable to devise a relatively inexpensive and convenient encapsulation package for hermetically sealing organic devices.

It is a purpose of the present invention to provide a new and improved encapsulation package for organic electroluminescent devices.

It is another purpose of the present invention to provide a new and improved encapsulation package for organic electroluminescent devices which efficiently dissipates heat.

It is a further object of the present invention to provide an encapsulation package for organic electroluminescent devices which acts as an effective barrier to oxygen and moisture.

SUMMARY OF THE INVENTION

Briefly, to achieve the desired objects of the instant invention in accordance with a preferred embodiment thereof, provided is an organic electroluminescent device array encapsulating package including an organic electroluminescent device on a supporting substrate. A cover having a rim engaging the supporting substrate is spaced from and encloses the organic electroluminescent device. A sealing material sealingly couples the rim of the cover to the supporting substrate around the organic electroluminescent device and spaced therefrom. A dielectric liquid having benign chemical properties fills the space between the cover and the organic electroluminescent device, providing both an efficient medium for heat transmission and an effective barrier to oxygen and moisture.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DESCRIPTION OF THE PREFERRED EMBODIMENT

Figure 1:
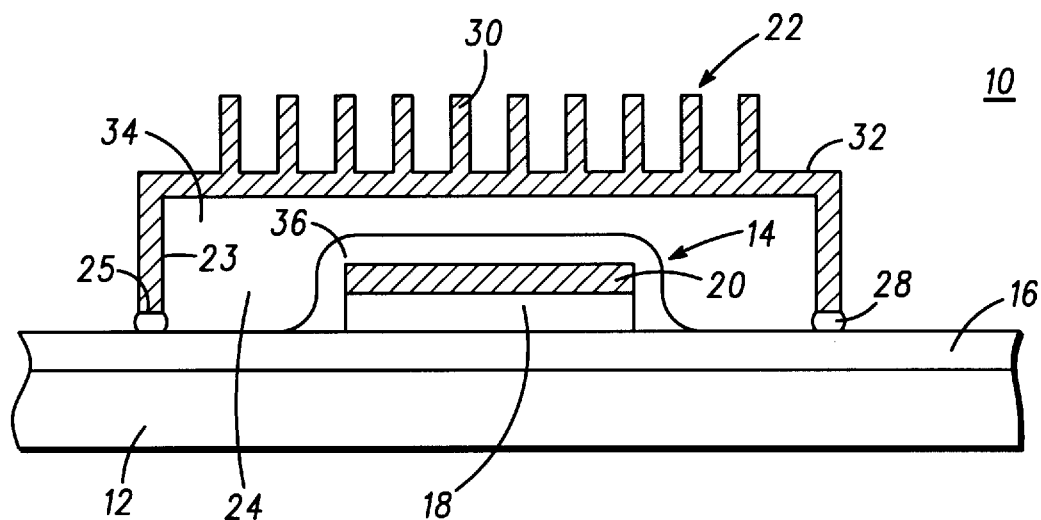
FIG. 1 is a simplified cross-sectional view of an organic electroluminescent device array encapsulation package.

Turning to the drawings in which like reference characters indicate corresponding elements through out the several views, attention is first directed to FIG. 1 which illustrates a simplified cross-sectional view of a hermetically sealed encapsulation package 10, in accordance with the present invention. Package 10 includes a supporting substrate 12 which is some optically clear material, such as glass, quartz, a transparent semiconductor material, plastics such as poly ether sulfones and poly acrylates with thin film dielectric barriers, or the like, etc. An organic electroluminescent device array 14 is positioned on substrate 12, generally by fabricating array 14 directly on substrate 12 in any of the various methods of fabricating organic electroluminescent devices.

As a specific example, array 14 includes a transparent layer 16 of conductive material, such as indium-tin-oxide (ITO) or the like, with an active organic layer 18, such as an organic electroluminescent layer, positioned thereon and a cathode 20 formed of a metal layer including a thin layer of a reactive metal. As previously stated, array 14 of organic electroluminescent devices, and especially the layer of reactive metal, is susceptible to oxygen and moisture in the surrounding atmosphere and must, therefore, be protected to provide reliability and a reasonable longevity.

Figure 2:
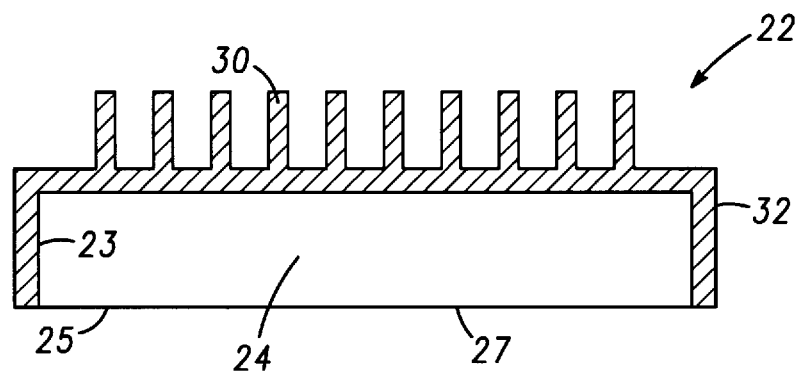
FIG. 2 is a sectional side view of a cover portion of the organic electroluminescent device array encapsulation package of FIG. 1.

With additional reference to FIG. 2, protection is provided in the form of a cover 22 having an inner surface 23 defining a chamber 24 and having a rim 25 defining an opening 27 in communication with chamber 24. The cover is placed over organic electroluminescent device array 14 with rim 25 engaging supporting substrate 12. In this manner, organic electroluminescent device array 14 is received in chamber 24 and spaced apart from inner surface 23. Cover 22 is hermetically sealed to supporting substrate 12 with a sealing material 28 sealingly coupling cover 22 to supporting substrate 12 along the entire rim 25 and around organic electroluminescent device array 14. Rim 25 is spaced from device array 14 to prevent shorts, etc. It will be understood that transparent layer 16 which is patterned on supporting substrate 12 can be interposed between rim 25 of cover 22 and supporting substrate 12 as is the case in the present embodiment, or can be completely enclosed within cover 22 with the other elements of organic electroluminescent device array 14. It is intended that engagement between rim 25 and supporting substrate 12 can be through sealing material 28 alone or sealing material 28 and transparent layer 16.

While protecting organic electroluminescent device array 14 from deleterious effects of ambient atmospheres, cover 22 also acts as a heat sink to draw heat therefrom. To this end, cover 22 is fabricated of a heat conductive metal, preferably copper or aluminum. To increase the efficiency with which cover 22 dissipates collected heat, fins 30 are added to an outer surface 32 thereof. Fins 30 increase the surface area of cover 22, thereby increasing the speed at which heat is dissipated.

To greatly increase heat dissipation and further protect organic electroluminescent device array 14 from the damaging effects of moisture and oxygen, a liquid 34 fills chamber 24, completely covering and engulfing organic electroluminescent device array 14. Liquid 34 is a dielectric having benign chemical properties so as not to interfere with the operation of organic electroluminescent device array 14. Liquid 34 is further selected to have suitable thermal properties such as vaporization and solidification temperatures. It has been found that fluorinated carbon liquids meet the desired criteria, and are therefore the liquids of preference.

Liquid 34 provides a very large environment for heat dissipation and an intimate contact to cover 22 which acts as a secondary heat sink. Furthermore, fluorinated carbon liquids are very hydrophobic. This characteristic aids in forming a barrier highly resistant to the diffusion of $H_2O$. By filling the space (chamber 24) between cover 22 and organic electroluminescent device array 14 with liquid 34, a highly effective barrier to moisture, and medium for heat transmission is provided.

Still referring to FIG. 1, organic electroluminescent device array 14 can include an integral encapsulation layer 36. Encapsulation layer 36 can be any conventional layer used for passivation of organic devices. It will be understood that integral encapsulation layer 36 can be omitted as desired.

Thus, a relatively inexpensive and convenient encapsulation package for hermetically sealing organic electroluminescent devices has been provided. The encapsulation package for organic electroluminescent devices efficiently dissipates heat and provides an effective barrier to oxygen and moisture.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

What is claimed is:

1. An organic electroluminescent device encapsulating package comprising:

an organic device on a supporting substrate;

a cover having a rim engaging the supporting substrate, and heat dissipating fins the cover spaced from and enclosing the organic electroluminescent device;

sealing material sealingly coupling the rim of the cover to the supporting substrate around the organic electroluminescent device and spaced therefrom; and a dielectric liquid having benign chemical properties filling the space between the cover and the organic electroluminescent device, the dielectric liquid including a fluorinated carbon liquid.

2. An organic electroluminescent device encapsulating package as claimed in claim 1 wherein the supporting substrate includes a transparent material.

3. An organic electroluminescent device encapsulating package as claimed in claim 2 wherein the organic electroluminescent device includes an organic layer positioned between a first contact and a second contact, the first contact being adjacent the transparent substrate and including a transparent material.

4. An organic electroluminescent device array encapsulating package comprising:

an organic electroluminescent device array carried by a transparent substrate;

a cover having an inner surface defining a chamber; a rim defining an opening in communication with the chamber and heat dissipating fins, the organic electroluminescent device being received in the chamber with the inner surface spaced therefrom;

sealing material sealingly coupling the rim of the cover to the transparent substrate around the organic electroluminescent device and spaced therefrom; and a dielectric liquid having benign chemical properties filling the chamber and engulfing the organic electroluminescent device, the dielectric liquid including a fluorinated carbon liquid.

5. An organic electroluminescent device encapsulating package comprising:

an organic device on a supporting substrate;

a cover having a rim engaging the supporting substrate, the cover being spaced from and enclosing the organic electroluminescent device, and the cover including fins extending outwardly therefrom to facilitate heat dissipation;

sealing material sealingly coupling the rim of the cover to the supporting substrate around the organic electroluminescent device and spaced therefrom; and a dielectric liquid having benign chemical properties filling the space between the cover and the organic electroluminescent device.

6. An organic electroluminescent device encapsulating package as claimed in claim 5 wherein the cover includes a heat conductive metal.

7. An organic electroluminescent device array encapsulating package comprising:

an organic electroluminescent device array carried by a transparent substrate;

a cover having an inner surface defining a chamber and having a rim defining an opening in communication with the chamber, the organic electroluminescent device being received in the chamber with the inner surface spaced therefrom, and the cover further including an outer surface having fins extending therefrom to facilitate heat dissipation;

sealing material sealingly coupling the rim of the cover to the transparent substrate around the organic electroluminescent device and spaced therefrom; and a dielectric liquid having benign chemical properties filling the chamber and engulfing the organic electroluminescent device.

8. An organic electroluminescent device array encapsulating package as claimed in claim 7 wherein the cover includes a heat conductive metal.

* * * * *